US005468972A

United States Patent [19]

Yamada

[11] Patent Number: 5,468,972

[45] Date of Patent: Nov. 21, 1995

[54] VACUUM DEVICE FOR CONTROLLING SPATIAL POSITION AND PATH OF ELECTRON

[75] Inventor: Keizo Yamada, Tokyo, Japan

[73] Assignee: NEC Corporation, Tokyo, Japan

[21] Appl. No.: 220,227

[22] Filed: Mar. 30, 1994

[30] Foreign Application Priority Data

Mar. 30, 1993 [JP] Japan .................................... 5-071404

[51] Int. Cl.[6] .................................................... H01L 29/06

[52] U.S. Cl. ............................ 257/10; 313/427; 313/308; 315/3.5

[58] Field of Search ................................ 257/10; 315/3.5, 315/39.3, 341, 349, 350, 351, 344; 313/308, 309, 336, 421, 426, 427; 378/122, 137

[56] References Cited

U.S. PATENT DOCUMENTS

| | | | |
|---|---|---|---|
| 3,755,704 | 8/1973 | Spindt et al. | 313/309 |
| 4,465,984 | 8/1984 | McDowell | 315/3.5 |
| 4,496,876 | 1/1985 | Young | 315/39.3 |
| 4,752,721 | 6/1988 | Nishida et al. | 313/427 |
| 4,871,950 | 10/1989 | Kuntzmann et al. | 315/39.3 |
| 4,939,413 | 7/1990 | Tomii et al. | 313/421 |
| 4,965,487 | 10/1990 | Freeman | 313/421 |
| 5,014,028 | 5/1991 | Leupold | 315/3.5 |
| 5,054,046 | 10/1991 | Shoulders | 313/308 |
| 5,156,988 | 10/1992 | Mori et al. | 437/40 |
| 5,280,490 | 1/1994 | Conde et al. | 372/2 |

FOREIGN PATENT DOCUMENTS

| | | | |
|---|---|---|---|
| 4220964 | 1/1993 | Germany | 313/421 |
| 4-236466 | 8/1992 | Japan . | |
| 2167227 | 5/1986 | United Kingdom | 257/10 |

*Primary Examiner*—Sara W. Crane
*Assistant Examiner*—Courtney A. Bowers
*Attorney, Agent, or Firm*—Young & Thompson

[57] ABSTRACT

A vacuum chamber is provided with an electron emission source on a first side wall, a collector on a second side wall opposite to the first side, and an insulated electrode on a bottom wall. Electrons emitted from the electron emission source move over the insulated electrode to be collected by the collector, so that the spatial position and the path of the electrons on the insulated electrode are controlled dependent on an electric potential generated by the insulated electrode.

9 Claims, 7 Drawing Sheets

VACUUM DEVICE FOR CONTROLLING SPATIAL POSITION AND PATH OF ELECTRON

FIELD OF THE INVENTION

This invention relates to a vacuum device for controlling spatial position and path of electrons, and more particularly to, a vacuum device having functions of transmitting, amplifying, oscillating, etc. of signals.

BACKGROUND OF THE INVENTION

A field effect type electron device which is turned on and off in speed higher than a field effect type semiconductor device is proposed in Japanese Patent Kokai No. 4-236466. The field effect type electron device comprises an insulating substrate for providing a bottom wall of an airtight chamber (vacuum) to emit electrons by receiving a light from a light source such as a laser diode, insulating wall members for providing the air-tight chamber cooperative with the insulating substrate for the bottom wall, source and drain electrodes provided on the both sides of the air-tight chamber, and a gate electrode provided on the top surface of the airtight chamber.

In operation, a light emitted from the light source is radiated on the back surface of the insulating substrate.

Thus, electrons are emitted from the insulating substrate into the air-tight chamber, so that two-dimensional electron gas is accumulated in the air-tight chamber. The electron gas is accelerated to be moved with high speed in the air-tight chamber by an electric field generated across the source and drain electrodes, wherein the motion of the electron gas is controlled by an external signal applied to the gate electrode, so that switching operation is carried out with the moving speed of electrons which is $2\times10^1$ cm/s in vacuum by the voltage of 10 V between the source and drain electrodes. This speed is higher than that in the conventional semiconductor device by one digit.

The field effect type electron device overcomes the below listed disadvantages which have been observed in metal wirings for interconnecting highly integrated semiconductor devices.

(1) It is difficult to maintain phases of electrons in a long distance, (2) The consumption of energy is large, (3) The delay of signals is large, (4) Cross talk can not be avoided among interconnections, (5) Migration is remarkably observed in accordance with the increase of current density, (6) The function of active devices such as transistors, etc. and that of passive devices such as interconnections, etc. are completely separated to make it impossible that the area of circuits is decreased, and (7) It is impossible to fabricate an amplifier such as a traveling wave tube, etc. utilizing the direct mutual action between electron and electromagnetic wave, because the moving speed of electrons in metal is slow not to be compared with the speed of electromagnetic wave.

The field effect type electron device has the advantages of overcoming the above described disadvantages.

However, the field effect type electron device has disadvantages as described below.

(1) It is impossible to propagate a plurality of separated electron waves emitted into vacuum in case where only narrow space is available as in a SLSI circuit, because a path of electron wave can not be designated, (2) Electrons are not distributed uniformly in vacuum, and (3) Complicated auxiliary devices such as a light source, etc. are required, and the consumption of electric power is therefore large.

SUMMARY OF THE INVENTION

Accordingly, it is an object of the invention to provide a vacuum device for controlling position and path of electrons in which a plurality of separated electron waves are propagated.

It is a further object of the invention to provide a vacuum device for controlling position and path of electrons in which electrons are uniformly distributed in vacuum.

It is a still further object of the invention to provide a vacuum device for controlling position and path of electrons in which no complicated auxiliary device is required.

It is a yet still further object of the invention to provide a vacuum device for controlling position and path of electrons in which the electric power consumption is reduced.

Accordingly to the invention, a vacuum device for controlling position and path of electrons, comprises:

at least one electron emission source for emitting electrons into a vacuum chamber;

at least one collector for collecting the electrons emitted into the vacuum chamber; and an electrode having a plane insulated by an insulating layer, the insulating layer being exposed to the vacuum chamber and positioned at a region between the electron emission source and the collector, whereby the electrode generates an electric potential on the insulating layer to control spatial position and path of the electrons in the vacuum chamber.

BRIEF DESCRIPTION OF THE DRAWINGS

The invention will be explained in more detail in conjunction with appended drawings, wherein.

DESCRIPTION OF THE PREFERRED EMBODIMENTS

Before explaining a vacuum device for controlling position and path of electrons in the first preferred embodiment according to the invention, the aforementioned field effect type electron device will be explained.

Figure 1:
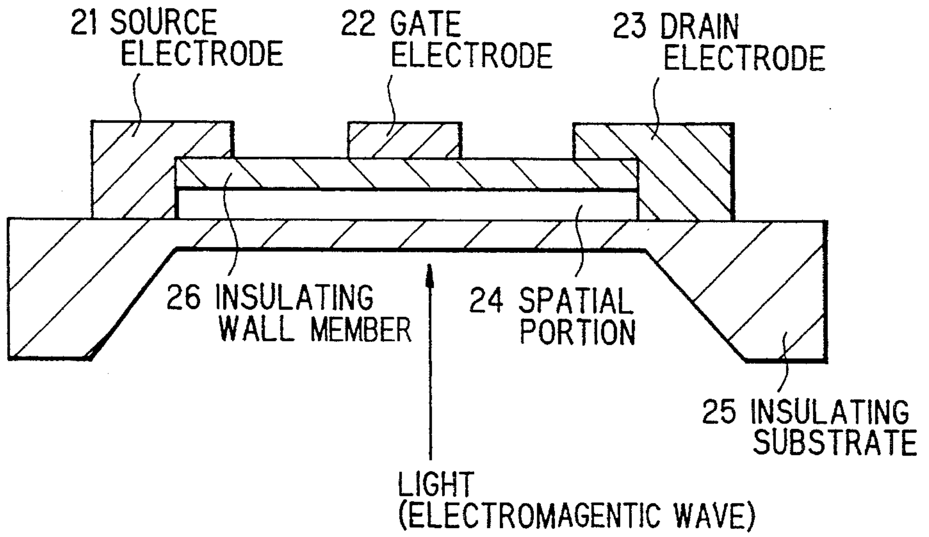
FIG.1 PRIOR ART
FIG. 1 is a cross-sectional view showing a conventional field effect type electron device.

FIG. 1 shows the field effect type electron device which comprises an insulating substrate 25, an insulating wall member 28, source and drain electrodes 21 and 23, and a gate electrode 22, wherein an air-tight vacuum chamber (spatial portion) 24 is defined by the insulating substrate 25 and the insulating wall member 28.

In operation, a light is radiated on the bottom surface of the insulating substrate 25 by a light source such as a laser diode (not shown), and two dimensional electron gas is accumulated in the vacuum chamber 24. The two dimensional electron gas is accelerated to be moved therein in accordance with an electric field generated by the source and drain electrodes 21 and 23. The motion of the election gas in controlled by the gate electrode 22 applied with an external signal, so that the switching operation is realized therein.

Next, a vacuum device for controlling position and path of electrons in the first preferred embodiment according to the invention will be explained in FIGS. 2A to 2C.

Figure 2A:
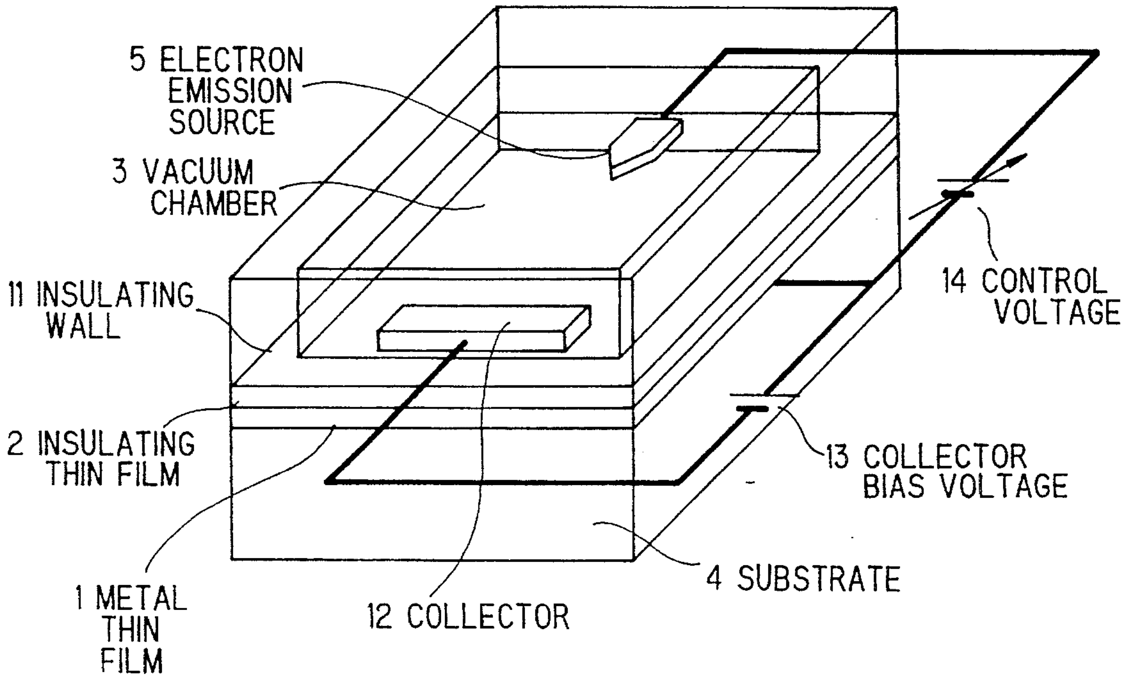
FIG. 2A is a perspective view showing a vacuum device for controlling spatial position and path of electrons in a first preferred embodiment according to the invention.

FIG. 2A shows a metal thin film 1 provided on an insulating substrate 4, an insulating thin film 2 provided on the metal thin film 1, an insulating wall provided on the insulating thin film 2 for defining a vacuum chamber 3, an electron emission source 5 for emitting electrons into the vacuum, chamber 3, a collector 12 for collecting electrons in the vacuum chamber 3, a collector bias voltage source 13 for applying a bias voltage to the collector 12, and a control voltage source 14 for applying a control voltage across the metal thin film 1 and the electron emission source 8.

Figure 2B:
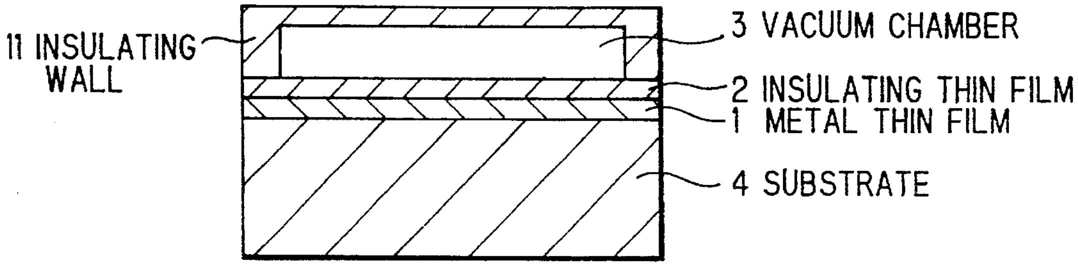
FIG. 2B is a cross-sectional view showing the vacuum device in the first preferred embodiment in FIG. 2A.
Figure 2C:
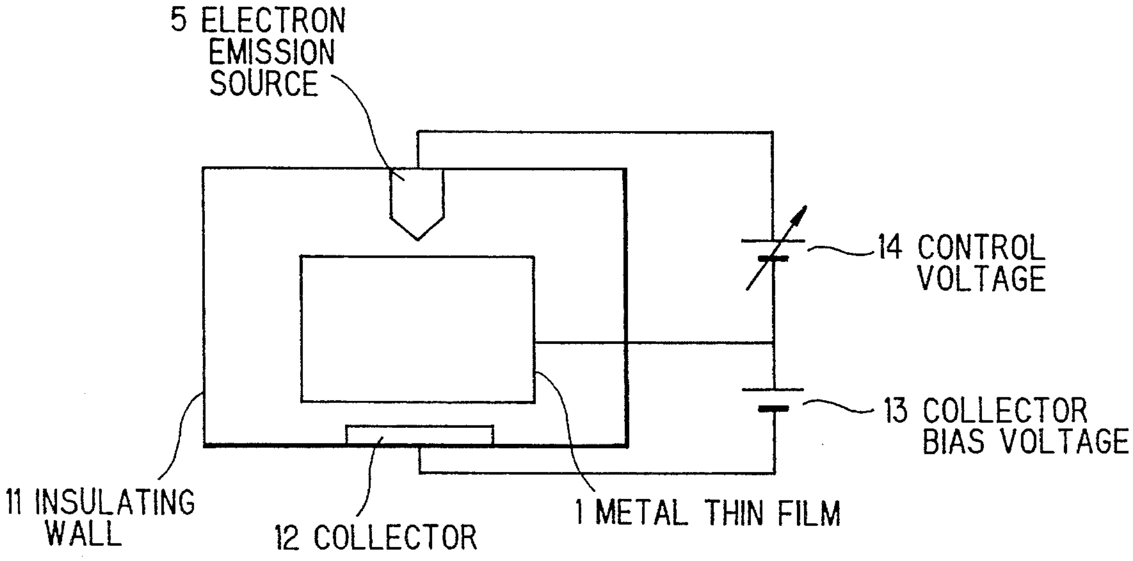
FIG. 2C is a diagram showing an electric circuit in the vacuum device in the first preferred embodiment in FIG. 2*a*, FIGS. 3 to 8 are cross-sectional views showing vacuum devices for controlling position and path of electrons in second to fifth preferred embodiments according to the invention.

FIG. 2B shows the cross section of the vacuum device for controlling position and path of electrons which is explained in FIG. 2A, wherein like parts are indicated by like reference numerals, and the voltage sources 13 and 14, the electron emission source 8, and the collector 12 are not shown, and FIG. 2C shows an electric circuit of the vacuum device for controlling position and path of electron which is explained in FIG. 2A, wherein like parts are indicated by like reference numerals.

In a practical use of the vacuum device for controlling position and path of electrons in the first preferred embodiment the metal thin film 1 may be patterned to be interconnection as used in SLSI circuits.

In operation, electrons are emitted from the electron emission source 5 into the vacuum chamber 3. In this state, the metal thin film 1 is applied with a positive voltage, so that a positive potential is generated on the surface of the insulating thin film 2. Thus, the electrons are pulled onto the insulating thin film 2 to be moved thereon in accordance with inertia applied to the electrons at the time of emission, and to be collected into the collector 12. In accordance with this principle, the transmission of signals is carried out by controlling the flow of electrons on a predetermined pattern of interconnections which are structured by the metal thin film 1.

On the other hand, when the metal thin film 1 is applied with a negative voltage, so that a negative potential is generated on the surface of the insulating thin film 2, the emitted electrons are made away from the insulating thin film 2 in the vacuum chamber 3.

As understood from the vacuum device for controlling position and path of electrons in the first preferred embodiment, when the positive static potential is generated on the insulating thin film 2, electrons are pulled thereonto to be lowered in energy, because the charge of the electrons is negative. That is, electrons can be collected at a position where the potential energy of the electrons is lowest by generating an inclined potential on the insulating thin film 2. The inclined potential may be generated by radiating a light on the insulating thin film 2 in place of applying a bias voltage to the metal thin film 1. As a matter of course, a magnetic field distribution may be used to modulate the distribution of electrons.

Figure 3:
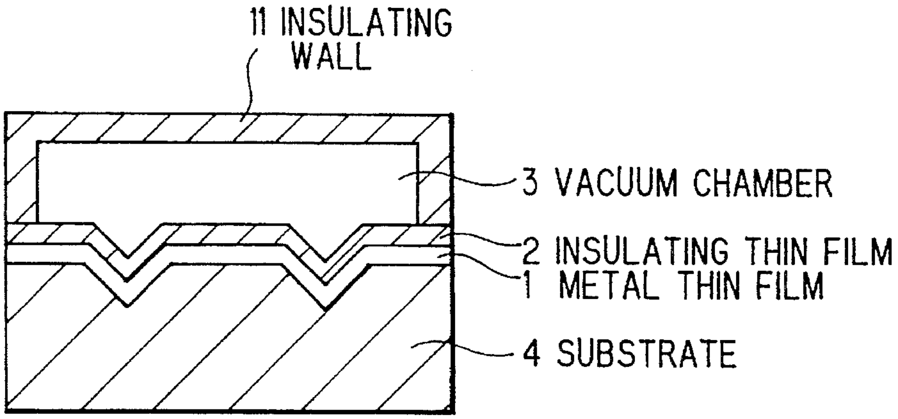

FIG. 3 shows a vacuum device for controlling position and path of electrons in the second preferred embodiment according to the invention, wherein like parts are indicated by like reference numerals as used in FIGS. 2A to 2C. In the second preferred embodiment, the metal and insulating thin films 1 and 2 are shaped to have two V-shaped grooves, and two electron emission sources (not shown) may be provided at the electron supply ends of the two V-shaped ends of the two V-shaped grooves. The two electron emission sources may be of a thermally or optically excited type electron emission source. In this structure, two electron paths are provided in the vacuum chamber 3, and the number of electron paths may be increased.

In operation, electrons are emitted from the two electron emission sources into the vacuum chamber 3. The emitted electrons are collected to be separately propagated in the lowest bottoms of the two V-shaped grooves.

Figure 4:
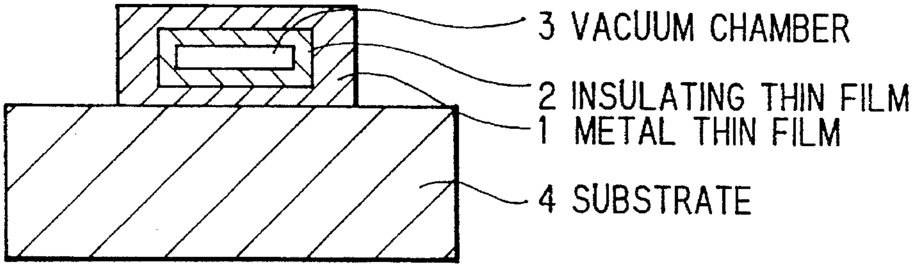

FIG. 4 shows a vacuum device for controlling position and path of electrons in the third preferred embodiment according to the invention, wherein like parts are indicated by like reference numerals as used in FIGS. 2A to 2C. In the third preferred embodiment, the vacuum chamber 3 is defined by tube-shaped metal and insulating thin films 1 and 2, and functions as a normal metal interconnection or an electron waveguide which is regarded identical to an optical waveguide or an electromagnetic waveguide.

Figure 5:
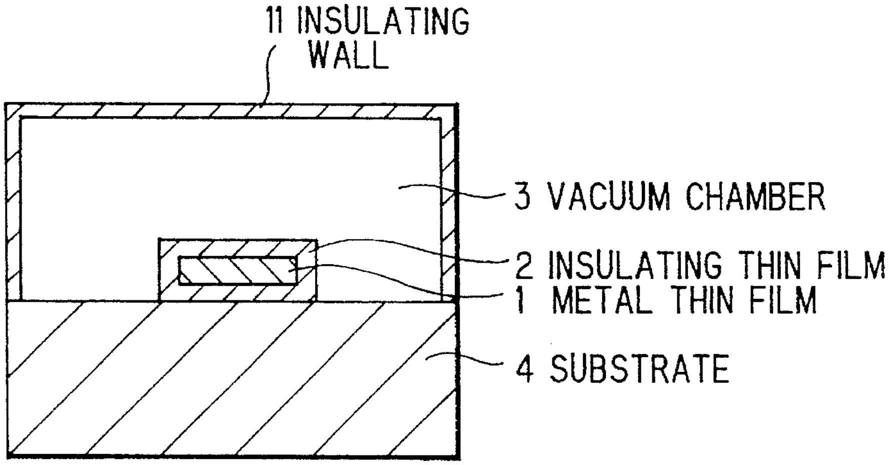

FIG. 5 shows a vacuum device for controlling position and path of electrons in the fourth preferred embodiment according to the invention, wherein like parts are indicated by like reference numerals as used in FIGS. 2A to 2C. In the fourth preferred embodiment, the metal thin film 1 is covered with the insulating thin film 2 in the vacuum chamber 3.

Figure 6:
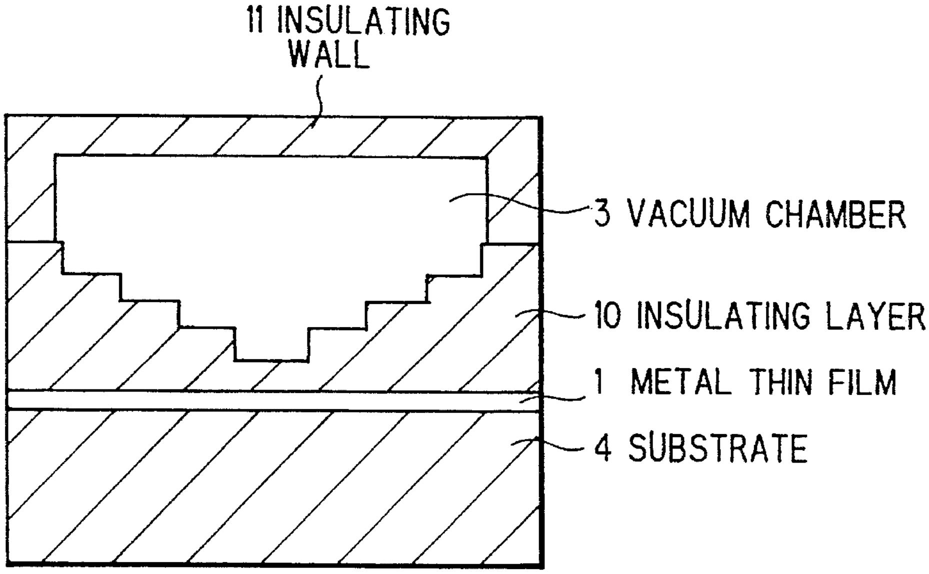

FIG. 6 shows a vacuum device for controlling position and path of electrons in the fifth preferred embodiment according to the invention, wherein like parts are indicated by like reference numerals as used in FIGS. 2A to 2C. In the fifth preferred embodiment, the insulating thin film 2 is replaced by an insulating layer 10 having a step-shaped top surface.

In general, plural electrons can not take the same quantum state, so that the electrons exist with different energies.

Consequently, the electrons are distributed in the order of lower energies to occupy different positions in a space. In the fifth preferred embodiment, four steps are provided in the vacuum chamber 3 to propagate electrons having four different energy states which can be used as information. The position of electrons is a function of applied potentials, so that the mutual action of electrons can be controlled by modulating a potential on the insulating layer 10. Consequently, the calculation can be carried out in the fifth preferred embodiment. The distribution of electrons is a function of step heights on the insulating layer 10, so that various calculations can be carried out by changing the step configuration. The distribution of electrons is controlled by a magnetic field, because each electron has spin. For this reason, magnets or material for changing an electromagnetic potential may be mixed with a material of the insulating layer 10, so that the position change of electrons is induced due to spin.

In a modification in the fifth preferred embodiment, it is assumed that the number of the steps is two to be defined first and second steps wherein the first step is lower in position level than the second step. For the first step, a first electron emission source is provided on an input side, and a first electron detector is provided on an output side.

In the same manner, a second electron emission source is provided on an input side of the second step, and a second electron detector is provided on an output side of the second step. In this situation, when the first electron emission source emits electron, no electron is emitted from the second electron emission source, a detected signal is obtained only from the first electron detector. Consequently, OR logic calculation is carried out by checking an output signal of the first electron detector. On the other hand, when the first and second electron emission sources emit electrons, detected signals are obtained from the first and second electron detectors. Consequently, an AND logic calculation is carried out by checking an output signal of the second electron detector.

Figure 7:
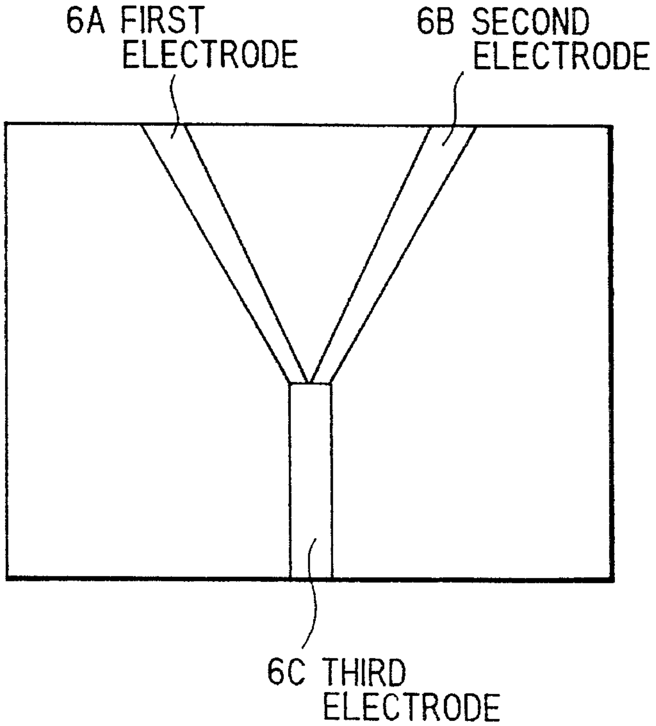
FIG. 7 is a plan view showing a vacuum device for controlling position and path of electrons in a sixth preferred embodiment according to the invention.

FIG. 7 shows a vacuum device for controlling position and path of electrons in the sixth preferred embodiment according to the invention, wherein the aforementioned metal thin film 1 is replaced by first to third electrodes 8A to 8C which are separately applied with first to third control voltages, and covered by the aforementioned insulating thin film 2, and the vacuum chamber 3 is provided on the insulating thin film 2, as explained in the first preferred embodiment.

In operation, the first electrode 6A is applied with the first control voltage of 0 V, and the second and third electrodes 6B and 6C are applied with the second and third control voltages of 5 V. In this state, electrons are emitted from the electron emission source (not shown) on the insulating thin film 2 above the third electrode 6C, so that the emitted electrons are controlled to flow in the direction of the third to second electrodes 6C to 6B. As understood from this operation, the following control is carried out.

| 1st electrode | 2nd electrode | 3rd electrode | electrons |
|---|---|---|---|
| 0 V | 5 V | 5 V | 3rd → 2nd |
| 5 V | 0 V | 5 V | 3rd → 1st |
| 5 V | 5 V | 5 V | 3rd → 1st<br>3rd → 2nd |
| 0 V | 0 V | 5 V | no flow |

Figure 8:
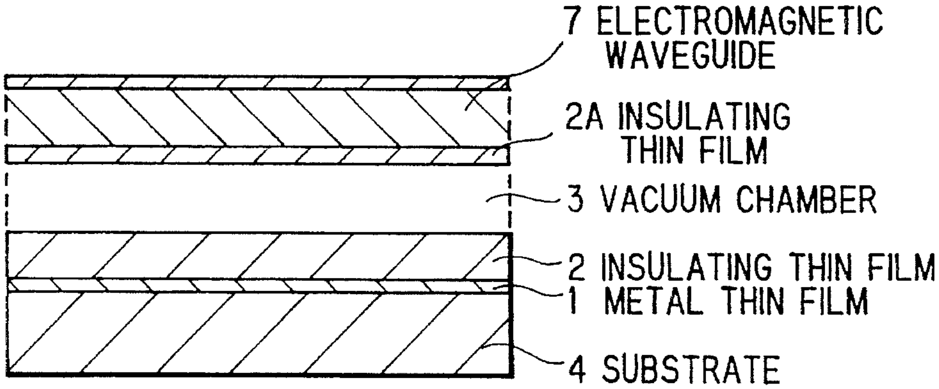
FIG. 8 is a cross-sectional view showing a vacuum device for controlling position and path of electrons in a seventh preferred embodiment according to the invention.

FIG. 8 shows a vacuum device for controlling position and path of electrons in the seventh preferred embodiment according to the invention, wherein like parts are indicated by like reference numerals as used in FIGS. 2A to 2C, and there are further provided an insulating thin film 2A and an electromagnetic waveguide 7 functioning as a delay circuit electromagnetic wave. In order to provide the delay circuit, the waveguide 7 is bent to be wave-patterned like a sine wave.

In general, a semiconductor device cannot be used to amplify a high,frequency signal having a frequency greater than microwave exceeding GHz. Therefore, an electron tube such as a traveling wave tube is used for this purpose. In such an electron tube, amplification is carried out by direct mutual action between electron and electromagnetic wave. This is different from amplification carried out by a transistor in which a kind of a value is opened and closed. The velocity of electrons is changed in accordance with the influence of potential generated by electromagnetic wave. This phenomenon provides significant effect, when the velocity of electrons is proximate to that of electromagnetic wave. In general, the velocity of electrons obtained in an electron device is less than the velocity of light. Therefore, it is necessary that the propagation velocity of electromagnetic wave is made smaller to small extent than that of electrons, for the purpose that electromagnetic wave is amplified by supplying energy form electrons to electromagnetic wave. In the seventh preferred embodiment, the electromagnetic waveguide 7 is bent to be made larger in length, thereby making the propagation velocity of electromagnetic wave slower than the traveling velocity of electrons in the vacuum device.

In this structure in the seventh preferred embodiment, the mutual action between electron wave and electromagnetic wave is possible to be held in a small space, so that a problem of switching speed caused by an input capacitance in a transistor is not found in this vacuum device. For this reason, amplification of an electromagnetic wave of a very high frequency is carried out in this preferred embodiment.

In the seventh preferred embodiment, the insulating thin film 2A may be omitted in case where the electromagnetic waveguide 7 is provided in the vacuum chamber 3. In this case, the electron wave channel, may be structured by a semiconductor device or a superconductive member.

Figure 9A:
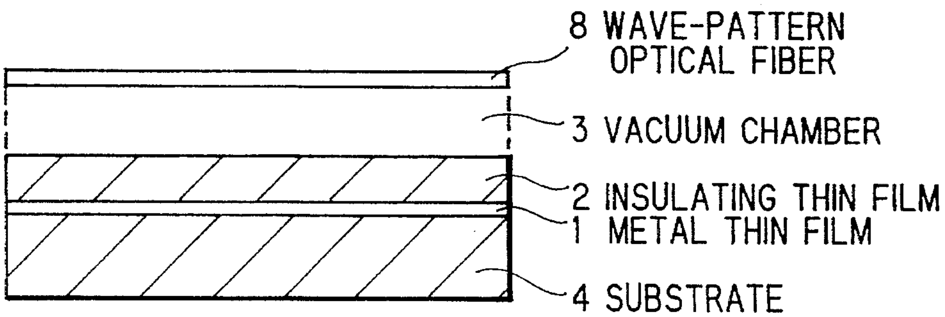
FIG. 9A is a cross-sectional view showing a vacuum device for controlling position and path of electrons in an eighth preferred embodiment according to the invention.
Figure 9B:
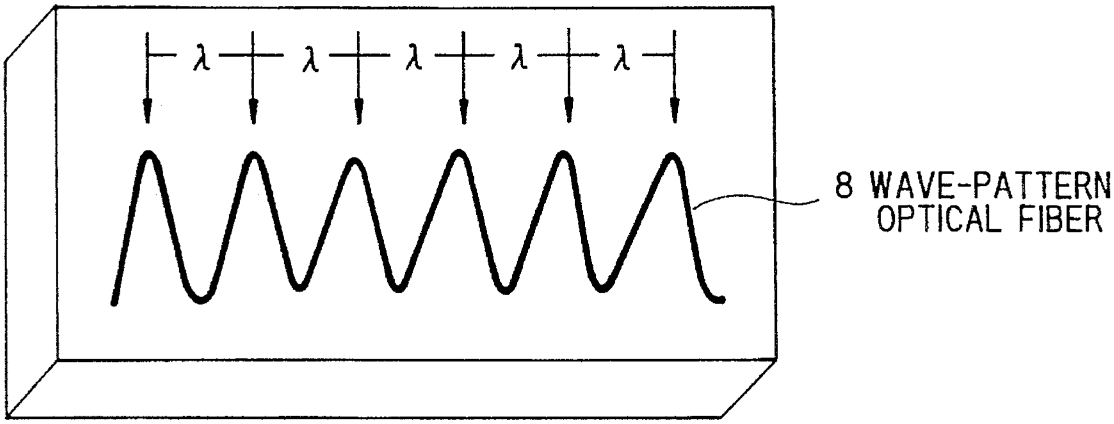
FIG. 9B is an explanatory view showing a wave-pattern optical fiber used in the eighth preferred embodiment.

FIG. 9A shows a vacuum device for controlling position and path of electrons= in the eights preferred embodiment according to the invention, wherein like parts are indicated by like reference numerals as used in FIG. 8, and the insulating thin film 2A and the electromagnetic waveguide 7 is replaced by a wave-pattern optical fiber 8 having a pitch λ equal to a wavelength of light as Shown in FIG. 9B.

In the eighth preferred embodiment, the optical fiber has a property in which light is leaked to induce mutual action with electrons in the vacuum chamber 3, so that the propagated light is amplified by a predetermined amplification factor.

Figure 10A:
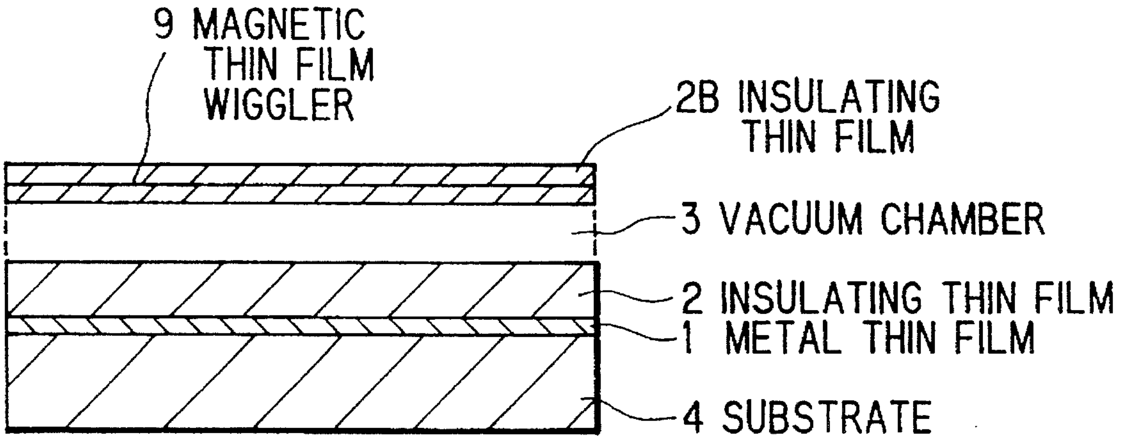
FIG. 10A is a cross sectional view showing a vacuum device for controlling position and path of electrons in a ninth preferred embodiment according to the invention.
Figure 10B:
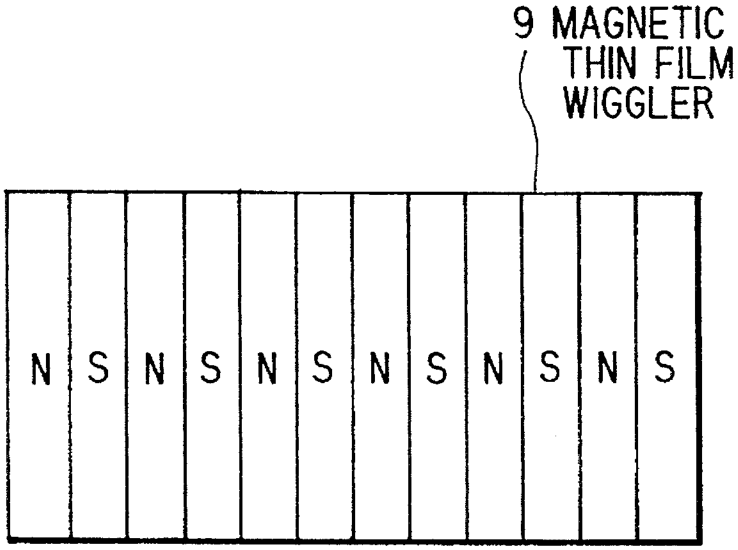
FIG. 10B is an explanatory view showing a magnetic thin film wiggler used in the ninth preferred embodiment.

FIG. 10A shows a vacuum device for controlling position and path of electrons in the ninth preferred embodiment according to the invention, wherein like parts are indicated by like reference numerals as used in FIG. 9A, and the wave-pattern optical fiber 8 is replaced by a magnetic thin film wiggler 9 sandwiched by insulating thin films 2B. The magnetic thin film wiggler 9 is shown in FIG. 10B.

Here, operation of the vacuum device in the invention will be again explained. Electrons are emitted from the electron emission source 5. Normally, electrons based on field emission, from which mono color electron bean is easy to be obtained, are used. The emitted electrons are pulled to be accumulated on the surface of the insulating thin film 2 above the metal thin film 1 applied with a bias voltage. Portion of the accumulated electrons are trapped to be fixed on the insulating thin film 2, while the remaining portion of the accumulated electrons are moved like free electrons in metal. In this state, a bias voltage is applied to the collector 12, so that the moving electrons are collected by the collector 12. Consequently, current flows from the electron emission source 5 to the collector 12. When the bias voltage is changed to be applied to the metal thin film 1, the amount of the accumulated electrons is changed to Change the flowing amount of electrons. This operation is identical to an ordinary vacuum tube.

In the ninth preferred embodiment, the accelerated electrons act mutually with the wiggler 9 to emit large electromagnetic wave dependent on the magnetic element pitch of the wiggler 9. The electromagnetic wave is introduced to a resonator to provide a free electron laser which is small in size as compared to a conventional one.

A magnetic field is generated by the magnetic thin film wiggler 9 which is provided on the path of electrons. The wiggler 9 is effective in using, for instance, a rare earth magnet. The magnetic thin film wiggler 9 can be magnetized by an external magnetic force. The wiggler is obtained in accordance with the writing of a magnetic pattern into a magnetic member by using a magnetic head for a magnetic recording system, so that a magnetic wiggler having a minute pitch of inverted magnetic directions which is not expected conventionally is easily obtained. The magnetic intensity and the position of the wiggler 9 are easily changed by applying an external voltage or heat thereto. Consequently, a free electron laser in which a wavelength is changed by an electric signal is obtained.

Figure 11:
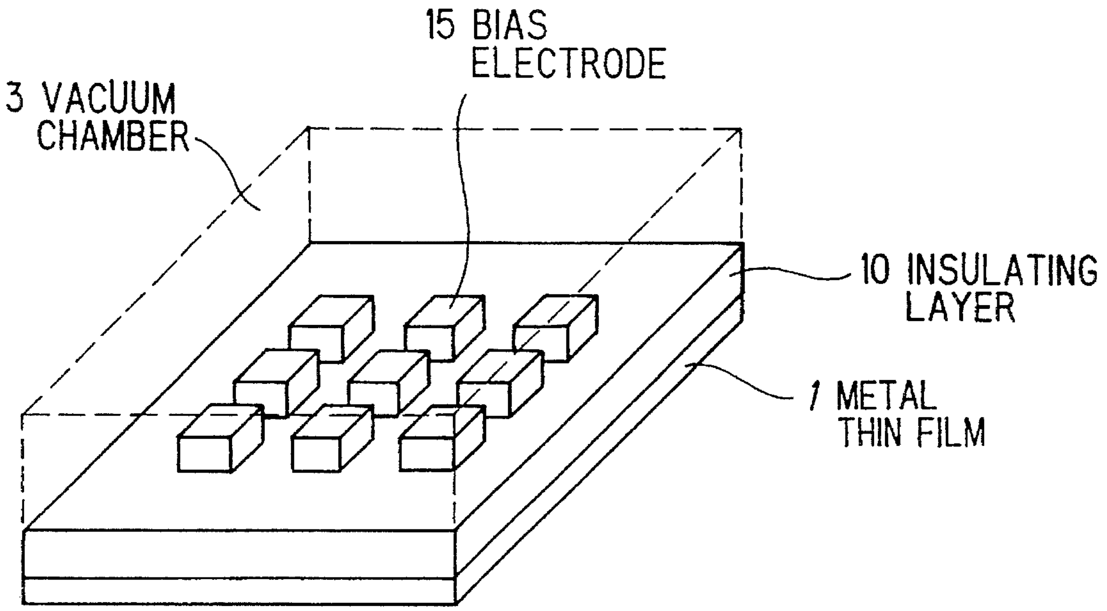
FIGS. 11 and 12 are explanatory views showing vacuum devices for controlling position and path of electrons in tenth and eleventh preferred embodiment according to the invention.

FIG. 11 shows a vacuum device for controlling position and path of electrons in the tenth preferred embodiment according to the invention, wherein like parts are indicated by like reference numerals as used so far, and an array of bias electrodes 15 each covered with an insulation and functioning as one electron are provided in the vacuum chamber 3 on the insulating layer 10.

In the tenth preferred embodiment, the configuration of electron cloud of atom is changed by controlling a bias voltage applied to the bias electrode 15. This means that the overlapping or colliding degree of adjacent electron clouds is changed dependent on levels of bias voltages applied to the bias electrodes 15, so that a conduction degree of electrons in the vacuum chamber 3 is modulated. For instance, an electron structure like a hexagonal fine structure or graphite is realized.

The vacuum device in the invention is considered to be a macro-model for the electron transfer phenomenon which is normally held in the interior of metal. Therefore, the understanding of electric conduction is deepened by using this model. Further, the calculation is carried out by electron wave interference, because the scattering state of electrons is controlled by an external bias voltage.

Figure 12:
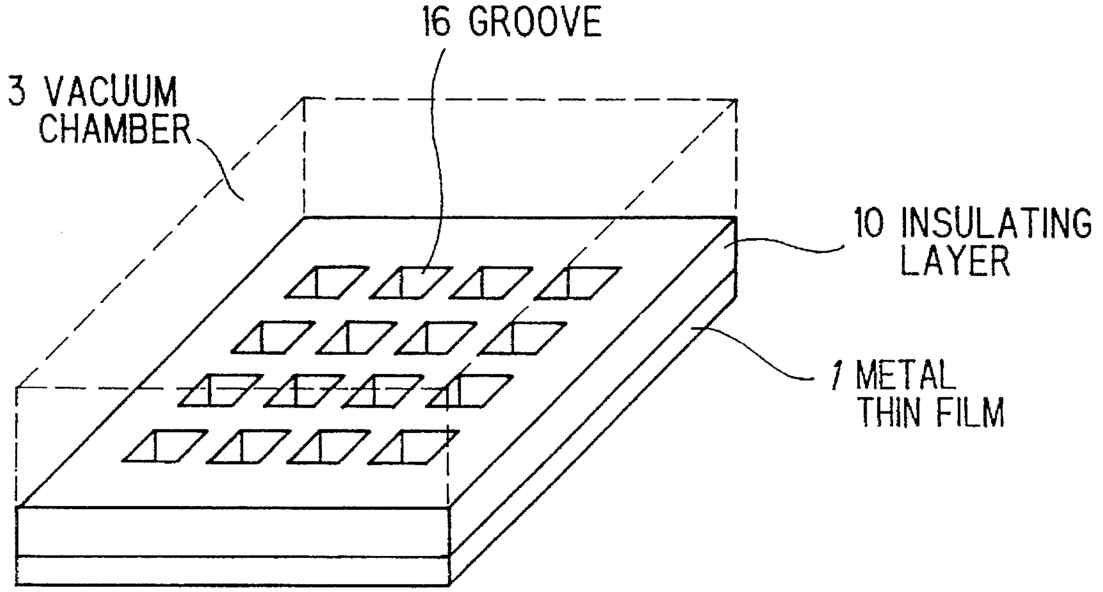

FIG. 12 shows a vacuum device for controlling position and path of electrons in the eleventh preferred embodiment according to the invention, wherein like parts are indicated by like reference numerals as used so far, and grooves 18 are provided on the insulating layer 10 in the vacuum chamber 3, so that potentials are lowered at the regions. In this case, the control portion of the groove 16 is lower in potential than other regions, so that the accumulation of electrons occurs thereat. Consequently, the same function as atom is obtained. Electrons which can not be inside the grooves 18 correspond to free electrons in metal. For this reason, the degree of electron conduction is changed by changing the size of the grooves In the eleventh preferred embodiment, the grooves may be of circle, so that the same structure as atom is obtained. Further, a configuration reflecting oscillation mode may be introduced for the grooves 16 to define the oscillation mode at ground state of electron. On the other hand, hexagonal grooves 16 may be adopted with sides being contacted to each other. For this structure, the same function as benzene ring is obtained to realize $\pi$ electrons in organic chemical. Consequently, it is useful for analyzing the mechanism of superconductor.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A vacuum device for controlling spatial position and path of electrons, comprising:

at least one electron emission source for emitting electrons into a vacuum chamber;

at least one collector for collecting said electrons emitted into said vacuum chamber; and means for generating an electric potential, said generating means being covered with an insulating layer facing an interior of said vacuum chamber and positioned at a region between said electron emission source and said collector, said generating means comprising first to third electrodes which generate first to third electric potentials, a terminating end of said first electrode being positioned in the vicinity of starting ends of said second and third electrodes, whereby said generating means generates an electric potential on said insulating layer to control spatial position and path of said electrons in said vacuum chamber.

2. A vacuum device for controlling spatial position and path of electrons, comprising:

at least one electron emission source for emitting electrons into a vacuum chamber;

at least one collector for collecting said electrons emitted into said vacuum chamber; and means for generating an electric potential, said generating means being covered with an insulating layer facing an interior of said vacuum chamber and positioned at a region between said electron emission source and said collector, said insulating layer comprising a plurality of steps having different heights on a surface thereof, whereby said generating means generates an electric potential on said insulating layer to control spatial position and path of said electrons in said vacuum chamber.

3. A vacuum device for controlling spatial position and path of electrons, comprising:

at least one electron emission source for emitting electrons into a vacuum chamber;

at least one collector for collecting said electrons emitted into said vacuum chamber;

means for generating an electric potential, said generating means being covered with an insulating layer facing an interior of said vacuum chamber and positioned at a region between said electron emission source and said collector, whereby said generating means generates an electric potential on said insulating layer to control spatial position and path of said electrons in said vacuum chamber; and a delay circuit provided on a plane of said vacuum chamber facing said insulating layer for delaying an electromagnetic wave, said delay circuit comprising an optical fiber formed in a wave pattern.

4. A vacuum device for controlling spatial position and path of electrons, according to claim 1, wherein:

said insulating layer has at least one groove on a surface thereof.

5. A vacuum device for controlling spatial position and path of electrons, according to claim 1, wherein:

said vacuum chamber comprises a delay circuit provided on a plane of said vacuum chamber facing said insulating layer, for delaying an electromagnetic wave being provided on said plane of said vacuum chamber.

6. A vacuum device for controlling spatial position and path of electrons, according to claim 5, wherein:

said delay circuit is an electromagnetic waveguide formed in a wave pattern.

7. A vacuum device for controlling spatial position and path of electrons, according to claim 1, wherein:

said vacuum chamber has a magnetic wiggler disposed on a plane opposite to said insulating layer, said magnetic wiggler being covered by an insulating layer provided on said plane of said vacuum chamber.

8. A vacuum device for controlling spatial position and path of electrons, according to claim 1, wherein:

said generating means is an array of insulated pillar-shaped type electrodes provided on said insulating layer.

9. A vacuum device for controlling spatial position and path of electrons, according to claim 1, wherein:

said insulating layer is provided with an array of grooves.

* * * * *